(12) United States Patent
Oh et al.

(10) Patent No.: US 12,711,292 B2
(45) Date of Patent: Aug. 18, 2026

(54) METHOD AND APPARATUS WITH CIRCUIT DESIGN PARAMETER GENERATION

(71) Applicant: SAMSUNG ELECTRONICS CO., LTD., Suwon-si (KR)

(72) Inventors: Youngmin Oh, Suwon-si (KR); Doyun Kim, Suwon-si (KR); Hyung-Dal Kwon, Suwon-si (KR); Yongwoo Lee, Suwon-si (KR); Bosun Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 742 days.

(21) Appl. No.: 18/310,656

(22) Filed: May 2, 2023

(65) Prior Publication Data

US 2024/0078361 A1 Mar. 7, 2024

(30) Foreign Application Priority Data

Sep. 2, 2022 (KR) ........................ 10-2022-0111515

(51) Int. Cl.
*G06F 30/27* (2020.01)
*G06F 30/3308* (2020.01)

(52) U.S. Cl.
CPC .......... *G06F 30/27* (2020.01); *G06F 30/3308* (2020.01)

(58) Field of Classification Search
USPC ........................................ 716/100, 101, 103
See application file for complete search history.

(56) References Cited

U.S. PATENT DOCUMENTS

| | | | | |
|---|---|---|---|---|
| 5,880,967 | A | 3/1999 | Jyu et al. | |
| 6,209,122 | B1 | 3/2001 | Jyu et al. | |
| 7,127,687 | B1 | 10/2006 | Signore | |
| 9,268,898 | B1 * | 2/2016 | Frost | G06F 30/367 |
| 2010/0293512 | A1 * | 11/2010 | Buck | G06F 30/30 716/113 |

(Continued)

FOREIGN PATENT DOCUMENTS

| | | |
|---|---|---|
| CN | 107369635 A | 11/2017 |
| CN | 112260652 A | 1/2021 |

(Continued)

OTHER PUBLICATIONS

Settaluri et al. "AutoCkt: Deep Reinforcement Learning of Analog Circuit Designs" *2020 Design, Automation & Test in Europe Conference & Exhibition* (*DATE*). IEEE, Jan. 20, 2020 (pp. 1-6).

(Continued)

*Primary Examiner* — Brian Ngo
(74) *Attorney, Agent, or Firm* — NSIP Law

(57) ABSTRACT

A method of generating a circuit design parameter meeting a target specification, the method including generating a first probability distribution of a first specification using a first model provided a first parameter where the first model is configured to infer a correlation between the first parameter and the first probability distribution, generating a second parameter using a second model provided the first probability distribution, and updating the first model based on the second parameter. The second model is trained by using a reward, the reward being determined based on a second probability distribution of a second specification corresponding to the second parameter.

20 Claims, 6 Drawing Sheets

100

(56) References Cited

U.S. PATENT DOCUMENTS

| | | | | |
|---|---|---|---|---|
| 2020/0094824 | A1* | 3/2020 | Schulter | G06F 30/20 |
| 2021/0264209 | A1* | 8/2021 | Kim | G06N 3/045 |
| 2022/0164756 | A1 | 5/2022 | Saihara | |

FOREIGN PATENT DOCUMENTS

| | | | |
|---|---|---|---|
| EP | 2 133 806 | A1 | 12/2009 |
| KR | 10-2253277 | B1 | 5/2021 |
| KR | 10-2021-0126033 | A | 10/2021 |
| KR | 10-2022-0060214 | A | 5/2022 |

OTHER PUBLICATIONS

Wang et al. "GCN-RL Circuit Designer: Transferable Transistor Sizing with Graph Neural Networks and Reinforcement Learning" *2020 57th ACM/IEEE Design Automation Conference* (*DAC*). IEEE, Apr. 30, 2020 (pp. 1-6).

Lee et al. "Analog Circuit Design with Dyna-Style Reinforcement Learning" *arXiv preprint arXiv:2011.07665*, Nov. 16, 2020 (pp. 1-8).

Yang et al. "Trust-Region Method with Deep Reinforcement Learning in Analog Design Space Exploration" *2021 58th ACM/IEEE Design Automation Conference* (*DAC*). IEEE, Dec. 2, 2021 (pp. 1-6).

* cited by examiner

METHOD AND APPARATUS WITH CIRCUIT DESIGN PARAMETER GENERATION

CROSS-REFERENCE TO RELATED APPLICATIONS

This application claims the benefit under 35 USC § 119(a) of Korean Patent Application No. 10-2022-0111515, filed on Sep. 2, 2022, in the Korean Intellectual Property Office, the entire disclosure of which is incorporated herein by reference for all purposes.

BACKGROUND

1. Field

The following description relates to a method and an apparatus with circuit design parameter generation.

2. Description of Related Art

In a typical design of a semiconductor device, various unintended physical or electrical characteristics may be present in the semiconductor device. Accordingly, the demand in the semiconductor industry for a process-device simulation environment based on a simulator is increasing, in order to overcome the limitations of semiconductor processes and devices, to understand the phenomena, and to reduce experimental costs. In addition, it is necessary to predict and simulate circuit design parameters that may be simulated which satisfies a target specification of the semiconductor device.

Typically, a user judges simulation results achieved from a simulation of a semiconductor device with various design parameters to find a circuit design parameter which satisfies the target specification. The user may then determine that the circuit design parameter is an optimal value. However, there may be other circuit design parameters may meet or exceed the desired target specification. In addition, there may also be other circuit design parameters that are highly likely to meet the target specification when applied in an actual manufacturing process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A method of generating a circuit design parameter meeting a target specification, the method including generating a first probability distribution of a first specification using a first model provided a first parameter where the first model is configured to infer a correlation between the first parameter and the first probability distribution, generating a second parameter using a second model provided the first probability distribution, and updating the first model based on the second parameter. The second model is trained by using a reward, the reward being determined based on a second probability distribution of a second specification corresponding to the second parameter.

The method may also include training the first model based on data obtained from a simulator outputting a third specification corresponding to a third parameter.

The method may also include training the first model using training data that includes the first parameter with a third probability distribution, generated by a simulated provided a third parameter being used as a ground truth.

The first parameter may be a virtual circuit design parameter.

The second parameter obtained may be another virtual circuit design parameter that is provided to the updated first model for further training of the first model.

The method may also include training the second model, the second specification being a state, respective operations of adjusting first parameters are actions, and the reward is based on the first probability distribution being determined based an increase in a previous action to a current action of adjusting the first parameter.

The reward may be determined based on a value obtained by subtracting a multiplication of a standard deviation of the first specification by a predetermined ratio from an average value of the first specification.

The actions may include an operation of adjusting each size of a plurality of transistors into respective different sizes.

The method may also include training the second model, the training may include assigning a high reward value in response to a standard deviation of the first specification being decreased compared to a previous standard deviation of a previous first probability distribution from the first model, and the first probability distribution may include the standard deviation.

The method may also include training the second model, the training including assigning a high reward value based on an average of specifications and a standard deviation of the first specification being increased compared to a previous average of specifications and standard deviation of the first specification.

The method may also include training the first model, including training the first model to decrease a difference between a third specification obtained by applying the first parameter to a simulator and a first specification.

The first parameter may be the circuit design parameter.

The circuit design parameter may be a size of a transistor.

The circuit design parameter may include a size corresponding to each of a plurality of transistors.

The method may also include transfer learning on the first model and the second model corresponding to a target specification and a new target specification including another specification.

In a general aspect a non-transitory computer-readable storage medium storing instructions that, when executed by a processor, cause the processor to perform the method.

In another general aspect an electronic device includes a processor configured to train a first model to infer a correlation between parameters and probability distributions with respect to a target circuit design specification, generate a first probability distribution of a first specification by applying a first parameter as a circuit design parameter, to the first model, generate a second parameter by applying the first probability distribution of the first specification to a second model, and update the first model based on the second parameter, and the second model is updated by using a reward determined based on a second probability distribution of a second specification corresponding to the second parameter.

The processor may also be configured to perform updating of the second model, including using a first reward based on the first probability distribution.

The reward may also be based on an action generated by an actor model provided at least the first probability distribution.

The training of the first model may be dependent on ground truths generated by a circuit design simulator.

Other features and aspects will be apparent from the following detailed description, the drawings, and the claims.

Figure 1:
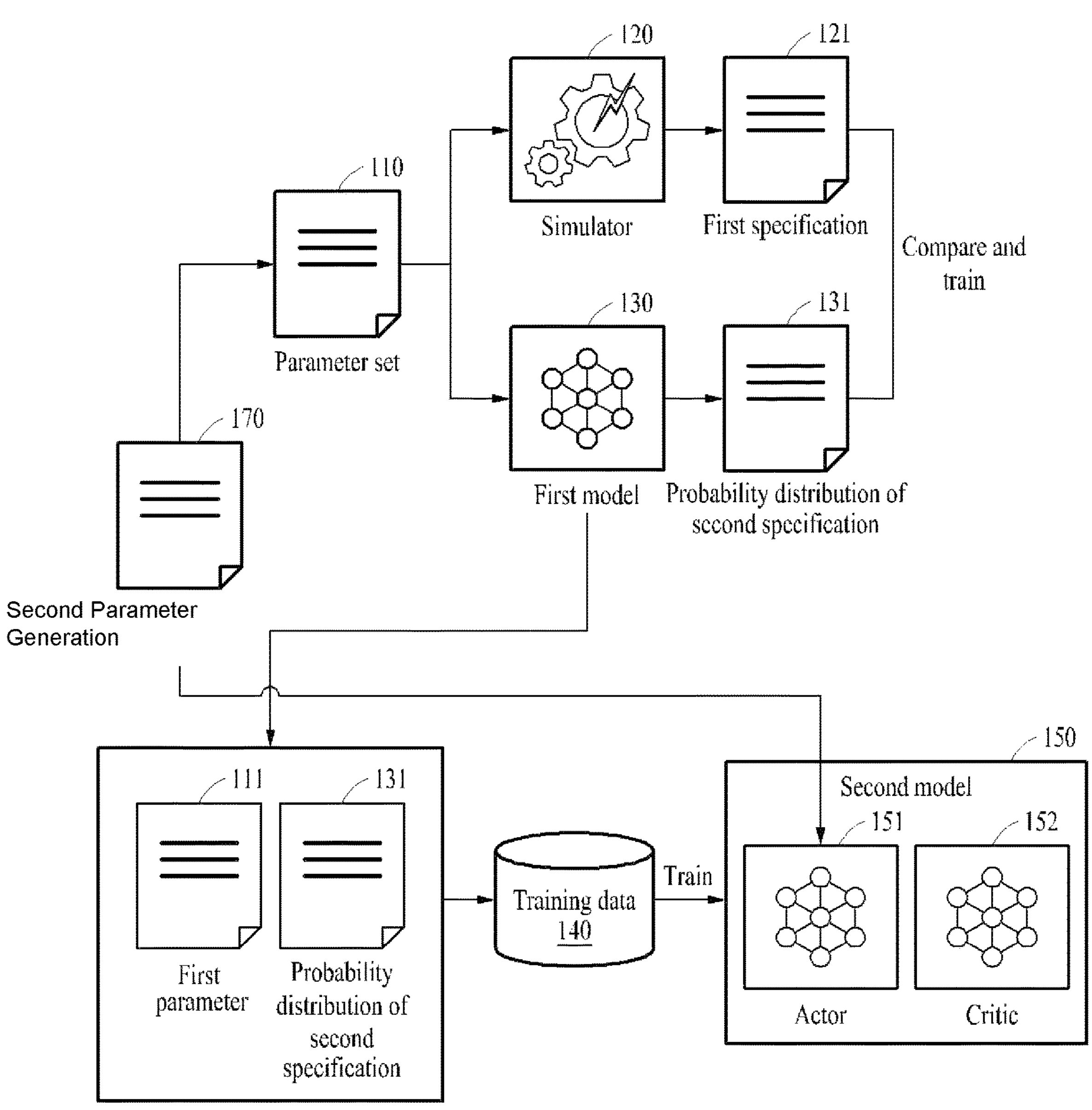
FIG. 1 illustrates an example of a method of generating a circuit design parameter meeting a target specification in a first model according to one or more embodiments.

Throughout the drawings and the detailed description, unless otherwise described or provided, the same or like drawing reference numerals may be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Terms, such as first, second, A, B, (a), (b) or the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Typically, a netlist may be a description of the various connections between the electronic circuits in a circuit design. There may be several circuit design parameters that meet the target specification of the netlist. A particular netlist may require a varying amount of different target specifications. For example, a netlist could include several target specifications which could include a first specification to achieve a lower power consumption, a second specification which places an importance on a certain operating frequency, and a third specification which desires a stable operation in a designated frequency band. As a result of the various specifications and their various outcomes, an artificial intelligence model may be desired as a solution to judge simulation results that can satisfy these various target specifications.

FIG. 1 illustrates an example of a method 100 of generating a circuit design parameter for a target specification.

With respect to method 100 of FIG. 1, a specification may refer to physical characteristics of a transistor. One specification may include at least one physical property. In other words, each physical property may be referred to as a specification item in this disclosure. For example, the specification item may include a gain, a unity gain bandwidth (UGBW), a phase margin (PM) and/or a bias current (BC) for a semiconductor device. In this context, a target specification may refer to a target physical characteristic of, in one example of a semiconductor, a transistor to be manufactured according to certain design parameters.

For example, the target specification may refer to a desired physical property value that the manufactured transistor should possess. For example, a netlist may include several target specifications which could include a first specification to achieve a lower power consumption, a second specification which places an importance on a certain operating frequency, and a third specification which desires a stable operation in a designated frequency band.

The term a 'circuit design parameter' may refer to a parameter related to circuit design. The circuit design parameter may include, for example, the size of the transistor. And thus, in an example in which there is to be a plurality of transistors, the circuit design parameter would include the size of each transistor. In some examples, there may be a certain correlation between the circuit design parameter and the physical properties of the transistor to be manufactured based on the circuit design parameter. That is, in one example, in order to design a transistor having a particular gain, that transistor should meet a certain size requirement. Thus, where a manufacturer would attempt to manufacture a semiconductor device that meets a target specification (e.g., desired performance outcomes described above), the manufacturer would first determine the different circuit design parameter values (e.g., physical properties) that would achieve that outcome. In one example, a machine learning model (e.g., a neural network) could be trained to determine a set of parameter values based on the target specification. The manufacturer could then manufacture the semiconductor device or devices based on those parameter values.

Referring to FIG. 1, a processor, such as processor 610 of FIG. 6 discussed below, may, in one example, be configured to perform a set of tasks to determine a set of parameters to meet a set of target specifications for a semiconductor device or set of semiconductor devices. Thus, in one example the processor 610 may be configured to apply a parameter set 110 to a simulator 120. The parameter set 110 may include a plurality of circuit design parameters for the semiconductor device or set of semiconductor devices.

In this example, the processor 610 will attempt to create a solution to find circuit design parameters for a transistor. For example, the parameter set 110 may include parameters included in a netlist and/or a process design kit (PDK). The processor 610, according to an example, may determine the specification by applying the parameter set 110 to the simulator 120. In more detail, the processor 610 may apply at least some parameters included in the parameter set 110 to the simulator 120 to obtain the specification of a transistor manufactured based on the applied parameters. Through this, the processor 610 may acquire a specification corresponding to each of the plurality of parameters. For example, the processor 610 may generate a (parameter, specification) data set that would define a transistor according to that transistor's target specification. The (parameter, specification) data set may also include a list of parameters for that transistor.

The processor 610 according to an example may apply the parameter set 110 to a first model 130. The processor 610 according to an example may apply a first parameter 111 included in the parameter set 110 to the first model 130. Both the first parameter 111 and a second parameter 170 may be different desired circuit design parameters. The first parameter 111 may refer to a parameter applied to the first model 130 and/or the simulator 120. The second parameter 170 may refer to a parameter generated by a second model 150. The second parameter 170 generated by the second model 150 may be added to the parameter set 110. Accordingly, the parameter set 110 may include existing parameters as well as addition parameters such as new parameters that were generated by the second model 150.

The processor 610, according to an example, may obtain a first specification 121 from the simulator 120. The first specification 121 may refer to output data obtained from the simulator 120. For example, the first specification 121 obtained from the simulator 120 may be an actual specification corresponding to a parameter applied to the simulator 120. The processor 610 according to another example may apply a circuit design parameter in a design scenario in which the first parameter 111 is an added noise value to be considered by the simulator 120. In this case, the processor 610 may obtain a noise specification or value corresponding to the parameter for which the noise value is to be obtained from the simulator 120. A second specification may be distinguished from the first specification 121 and may refer to output data obtained from a result of the first model 130. For example, the second specification may be a prediction specification corresponding to a parameter applied to the first model 130.

The processor 610, according to an example, applies the first parameter 111 to the first model 130 in which the correlation between the first parameter 111. In this example, the first design parameter is a circuit design parameter. Next, the probability distribution of the specification is trained to obtain a probability distribution. The processor 610 may obtain a probability distribution 131 of the second specification by applying the first parameter 111 to the first model 130. The term "second specification" may be employed to help distinguish between a specification which is data output from the simulator 120 and another specification which is data that is output from the first model 130. The processor 610, according to another example, may obtain a noise specification by applying a parameter in which a noise value is added to the first parameter 111 for the first model 130. For example, the processor 610 may obtain a probability distribution resulting from the noise specification from the first model 130.

The first model 130 may be a model trained to generate a probability distribution of a specification corresponding to a parameter applied to the model. The first model 130 may include a model trained based on a specific specification (e.g., the first specification 121) corresponding to a circuit design parameter (e.g., the first parameter 111) applied to the simulator 120 and a circuit design parameter (e.g., the first parameter 111) applied to the simulator 120. The processor 610 may obtain the first specification 121 by using the simulator 120. The processor 610 may apply the parameter applied to the simulator 120 to the first model 130. In addition, the processor 610 may obtain the probability distribution 131 of the second specification from the first model 130. The processor 610 according to an example may update the first model 130 by comparing the specification 121 with the probability distribution 131 of the second specification. Through this, the first model 130 may learn the correlation between the parameter and the probability distribution of the specification. The probability distribution of the specification may be expressed as the average of specifications, the distribution of the specification, and/or the standard deviation of the specification.

The processor 610 according to another example may apply the parameter applied to the simulator 120 to the first model 130. The processor 610, according to an example, may obtain the second specification from the first model 130. The processor 610, according to an example, may update the first model 130 by comparing the first specification 121 with the second specification. Through this, the first model 130 may be trained on the corresponding relationship between the parameter and the specification.

The first model 130 may be a model trained based on training data in which the circuit design parameter is the training input data and the probability distribution of the specification is the ground truth data. In supervised learning, ground truth data may exist. The processor 610 may train the first model 130 so that the output of the first model 130 becomes close to the ground truth data. The ground truth data may be an output of the simulator 120. Accordingly, the ground truth data may be the first specification 121 and/or the probability distribution of the first specification 121. The processor 610 may use the first parameter 111 applied to the simulator 120 as training input data and train the first model 130 based on the training data in which the probability distribution of the first specification obtained from the simulator 120 is the ground truth data. Accordingly, the processor 610 may generate the first model 130 which mimics the output of the simulator 120. The processor 610 may obtain not only the actual circuit design parameter and data of the actual specification corresponding to the actual circuit design parameter through the first model 130, but also the specification corresponding to the circuit design parameter through the model 130 when there are no actual circuit design parameters. Through this, the processor 610 may obtain various training data for training the second model 150 through the first model 130.

The first model 130 may be a model for generating a probability distribution of a specification corresponding to a virtual circuit design parameter. The virtual circuit design parameter may be a parameter distinguished from the actual circuit design parameter. The virtual circuit design parameter may be a parameter obtained through a model (e.g., a neural network). Therefore, an actual specification corresponding to the virtual circuit design parameter may not exist. The reason is that there is no transistor manufactured based on a virtual circuit design parameter, so the actual specification of the manufactured transistor is not known. Accordingly, when the virtual circuit design parameter is applied to the simulator 120, an inaccurate specification may be output or no specification may be generated. On the other hand, because the first model 130 is a model in which the correlation between the circuit design parameter and the probability distribution of the specification is trained, even if the virtual circuit design parameter is applied to the first model 130, a probability distribution of the specification with high accuracy may be output. As an example and not by way of limitation, the virtual circuit design parameter may be a parameter obtained using the second model 150. For example, the virtual circuit design parameter may include the second parameter 170 obtained from the second model 150.

The processor 610, according to an example, may obtain an actual specification corresponding to the actual circuit design parameter when the actual circuit design parameter is applied to the simulator 120. However, when the processor 610 applies the virtual circuit design parameter to the simulator 120, a specification corresponding to the virtual circuit design parameter may not be acquired. The reason is that the simulator 120 may not output a specification corresponding to all circuit design parameters. Another reason is that the simulator 120 may output only the specification obtained through an actual experiment.

The processor 610 according to an example may obtain the second parameter 170 by applying the obtained probability distribution of the specification to the second model 150. The second model 150 may be a model trained to generate a circuit design parameter which meets the target specification.

Figure 4:
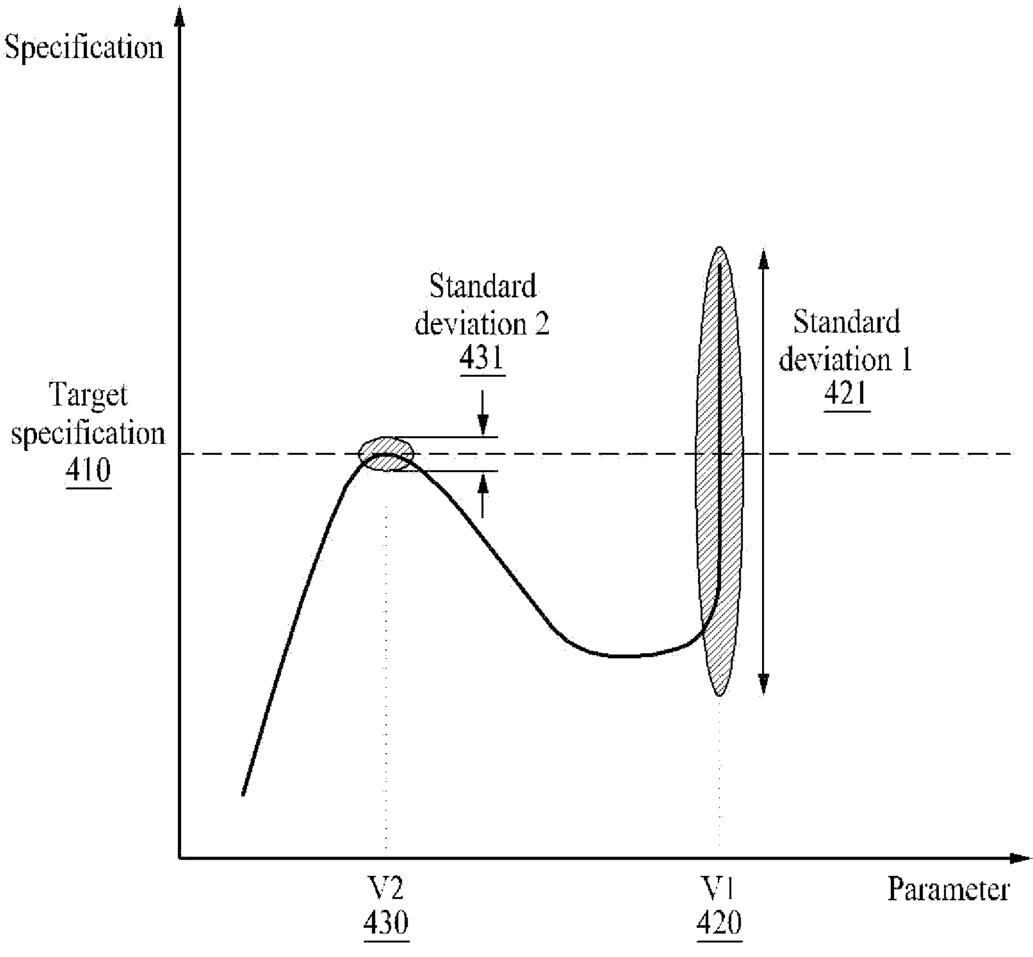
FIG. 4 illustrates an example of a case in which there is a plurality of circuit design parameters meeting the target specification according to one or more embodiments.

Referring to FIG. 4, there may be at least two parameters satisfying a target specification 410. For example, a parameter V1 420 and a parameter V2 430 may both be circuit design parameters which meet the target specification 410. However, in the actual semiconductor manufacturing process, an error may exist in the circuit design parameter value, and even with the same error value, the larger the probability distribution of the specification (e.g., the greater the distribution or standard deviation), the greater the difference from the target specification. Accordingly, even if an error occurs in the circuit design parameter, a circuit design parameter capable of obtaining a specification which does not significantly deviate from the target specification may be more suitable for the semiconductor manufacturing process. As shown in FIG. 4, a first standard deviation 1 421 of the specification corresponding to the parameter V1 420 may be greater than a second standard deviation 2 431 of the specification corresponding to the parameter V2 430. Accordingly, when an error of 1 occurs based on the parameter V1 420 and when an error of 1 occurs based on the parameter V2 430, the deviation of the specification may be greater for the parameter V1 420. Accordingly, the semiconductor manufactured using the parameter V2 430 may have a higher probability of meeting the target specification than the semiconductor manufactured using the parameter V1 420.

The second model 150 may be a model trained with reinforcement learning (RL). For example, the second model 150 may be a model including an actor 151 and a critic 152 in reinforcement learning. The actor 151 may be a model which determines an action when a state is given. The critic 152 may be a model for evaluating the value of a state.

The second model 150 may be a model trained based on the training data 140 including the first parameter 111 and the second specification (or the probability distribution of the second specification).

Figure 3:
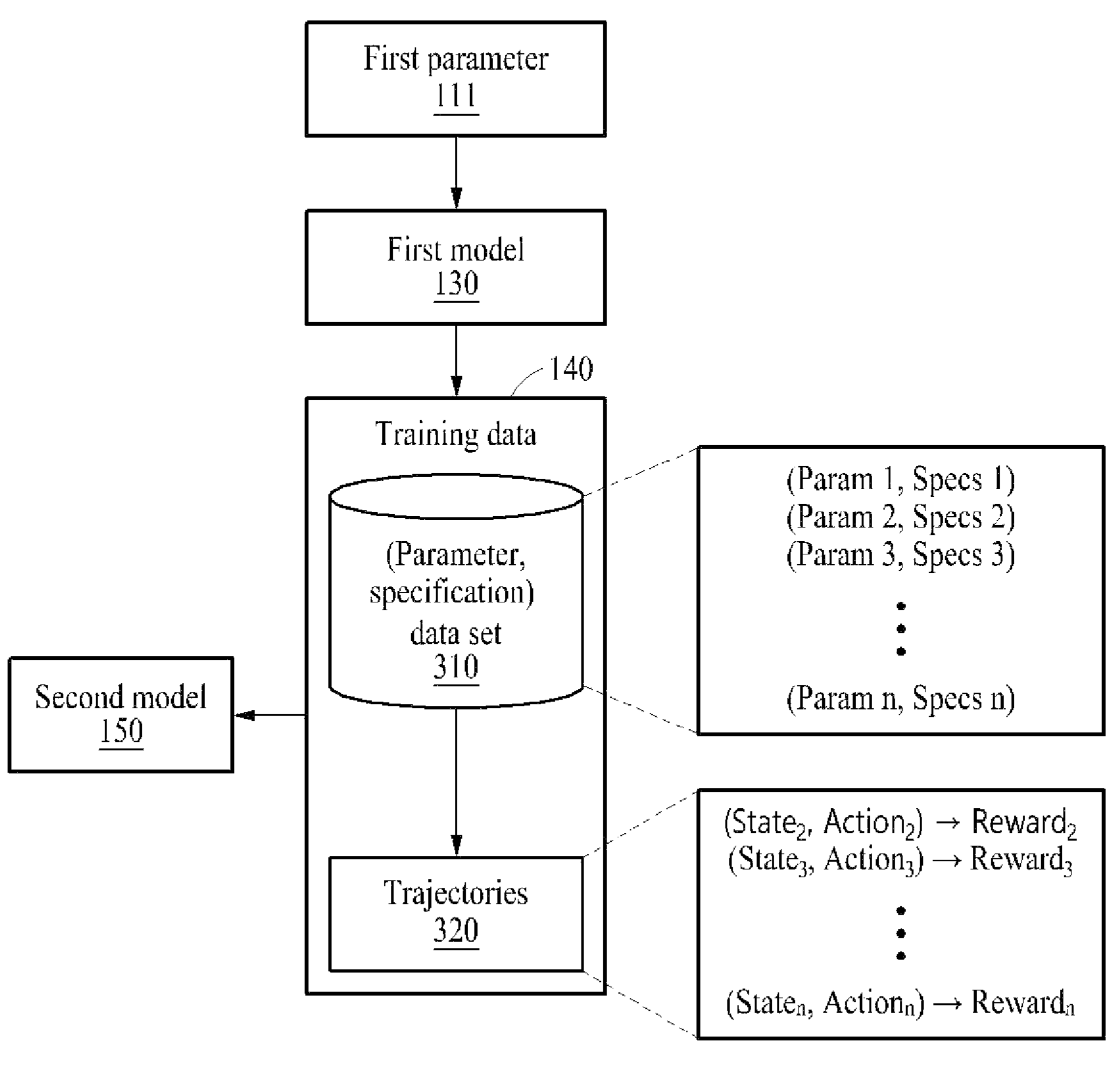
FIG. 3 illustrates an example of training data according to one or more embodiments.

The training of data 140 is described in detail with reference to FIG. 3. Referring to FIG. 3, the processor 610 may be configured to perform a training 300 according to an example where the processor 610 may apply the first parameter 111 to the first model 130. In addition, the processor 610 may obtain the first parameter 111 and data pairs of a specification corresponding to the first parameter 111. The processor 610 may generate a (parameter, specification) data set 310 by using the output of the first model 130. As shown in FIG. 3, Specs 1, a specification corresponding to a parameter Param 1, and Specs 2, a specification corresponding to a parameter Param 2, may exist in pairs. The processor 610 according to an example may obtain trajectories 320 by applying the (parameter, specification) data set to the second model 130.

In a reinforcement learning method of the second model 150, a state may be a specification. In another example, a state may be (parameter, specification, target specification). A state may be expressed by concatenating a vector expression of a parameter, a vector expression of a specification, and a vector expression of a target specification.

An action may be an operation of adjusting a circuit design parameter. For example, the parameter may include the size of each of the plurality of transistors. In this case, the action may include adjusting the sizes of the plurality of transistors to different sizes. For example, when there are 7 transistors, the action may include adjusting the size of each of the transistors. In another example, when the size of 7 transistors and the size of one resistor are circuit design parameters, the action may include adjusting the size of each of the 7 transistors and the size of the one resistor. The action may include adjusting the size of each of the transistors or the resistor into different sizes.

A reward may be a value determined based on a probability distribution of a specification determined according to an action. The reward may be determined based on the standard deviation of the specification and the average of specifications determined according to the action.

The processor 610, according to an example, may train the second model 150 in a way that a larger reward is assigned as a value, such as a value that is determined based on the average of the specifications and the standard deviation of the specification, increases. The reward may be determined based on a value obtained by subtracting the multiplication of the standard deviation of the specification by a predetermined ratio from the average of the specifications. For example, the reward may be determined as (average of specifications)−C*(standard deviation of specification). C may be a constant. For example, C may be "1", "2" or "3".

In the present disclosure, the reward may be a conservative reward. The processor 610, according to an example, may generate a robust circuit design parameter by setting a conservative reward. The robust circuit design parameter may be a parameter which minimizes a standard deviation or a distribution of the specification among a plurality of parameters which satisfy the target specification. For example, a conservative reward may be set as (average of specifications)−3*(standard deviation of specification) (e.g., $\mu-3*\sigma$). Here, $\mu$ may be the average and a may be the standard deviation. For a 99% confidence interval, C may be 3.

Therefore, the larger the average of the specifications or the smaller the standard deviation of the specification, the larger the reward may be. The processor 610 may update the second model 150 in a way such that the reward is increased. The processor 610, according to an example, may train the second model 150 in a way that a larger reward is assigned as the standard deviation of the specification decreases, based on the probability distribution of the specification. The processor 610, according to an example, may train the second model 150 in a way that a larger reward is assigned as the average of the specifications increases, based on the probability distribution of the specification.

The trajectories 320 may refer to a sequence of the state and the action. The trajectories 320 may further include a record of rewards assigned when the processor 610 takes an action in a particular state. For example, the trajectories 320 may include a record of a reward Reward 2 assigned when the processor 610 takes a particular action $Action_2$ in a state $State_2$.

The processor 610, according to an example, may train the second model 150 by using the training data 140 including the (parameter, specification) data set 310 and the trajectories 320. Through this, the processor 610 may determine the circuit design parameter to which the maximum reward is assigned as the second parameter by using the second model 150.

The training data 140 may include data generated based on the first model 130. In addition, the training data 140 may not include data generated based on the simulator 120. Accordingly, the training data 140 may include the probability distribution 131 of the second specification, but may not include the first specification. Through this, the second model 150 may be trained through data generated using the first model 130.

The processor 610, according to an example, may update the first model 130 based on the second parameter 170. The processor 610 according to an example may retrain the first model 130 by using the second parameter 170. Through this, the first model 130 may also perform training on the parameters obtained from the second model 150. Furthermore, the processor 610 may generate the training data 140 including more various cases by using the first model 130.

By using the first model 130 and the second model 150 described in the present disclosure, the second model 150 may be quickly retrained even when there are various specification changes. The processor 610, according to an example, may perform transfer learning on the first model 130 and the second model 150 in response to a new target specification including a specification item different from the target specification. For example, if the existing target specification includes values such as a gain and a UGBW, and the new target specification includes values such as a PM and a BC, and the processor 610 may perform transfer learning on the first model 130 and the second model 150 in response to the new target specification. Since the first model 130 and the second model 150 are models trained in response to the existing target specification, the processor 610 may obtain a model which may generate an optimal circuit design parameter in response to the new target specification through transfer learning. Through this, the processor 610 may obtain an optimal circuit design parameter by using the second model 150 adapted to the new specification.

In addition, even when the specification or an item of the circuit design parameter changes, the processor 610 may perform transfer learning on the first model 130 and/or the second model 150, so that a new circuit design parameter or the first model 130 and/or the second model 150 adapted to the new specification may be generated.

Figure 2:
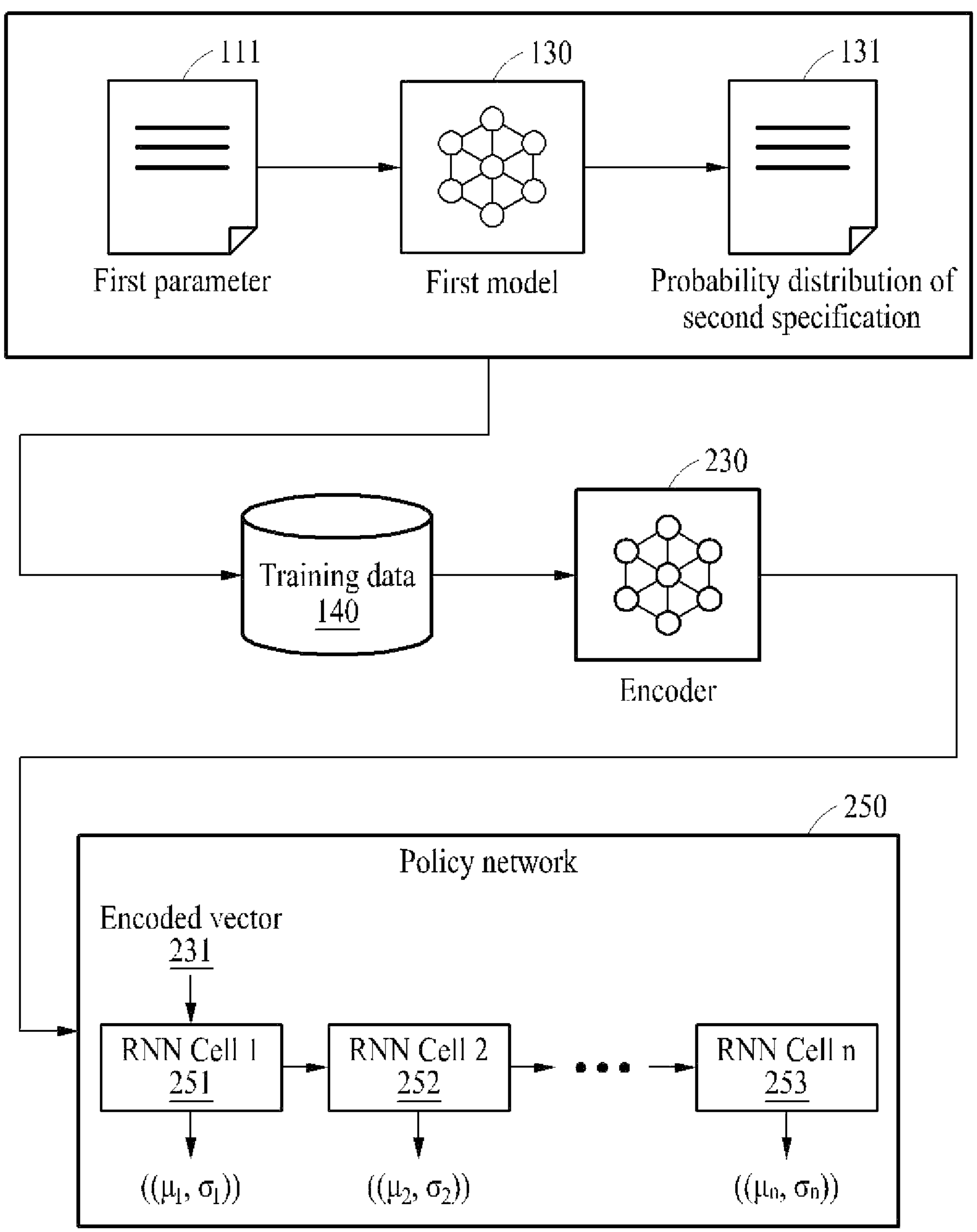
FIG. 2 illustrates an example of a usage of a recurrent neural network (RNN) in a second model according to one or more embodiments.

FIG. 2 illustrates an example of a usage of a recurrent neural network (RNN) 200 in a second model. In one example, the RNN 200 may be implemented by the processor 610 of FIG. 6.

Since the first parameter 111, the first model 130, the probability distribution 131 of the second specification, and the training data 140 are described in detail with reference to FIG. 1, a detailed description thereof is omitted in this drawing.

The processor 610 according to an example may input the training data 140 to an encoder 230. The processor 610 may input the state and action included in the training data 140 to the encoder 230. The state may be a specification as described above. In another example, the state may be expressed with values include (parameter, specification, target specification). The action may be an adjustment of the circuit design parameter as described above. For example, the action may be an increase or decrease of the circuit design parameter value. The processor 610 may obtain an encoded vector 231 using the encoder 230. In addition, the processor 610 may apply the encoded vector 231 to a policy network 250. The policy network 250 of FIG. 2 may correspond to the actor 151 of FIG. 1. The policy network 250 may be implemented using an RNN. The RNN may be a model used to predict the next data by applying time series data. The processor 610 may apply the encoded vector 231 to an RNN Cell 1 251 to obtain the average and the standard deviation (e.g., $(\mu_1,\sigma_1)$) of the specification. The processor 610 may calculate the reward by using the average and the standard deviation of the specification. In addition, the processor 610 may obtain the average and the standard deviation (e.g., $(\mu_2,\sigma_2)$) of the specification by applying the output of the RNN Cell 1 251 to an RNN Cell 2 252. In addition, the processor 610 may calculate the reward by using ($\mu_2$,$\sigma_2$). Such a series of sequences may be included in the trajectories 320 of FIG. 3. Similarly, such a method may be applied to the remaining RNN Cells.

Figure 5:
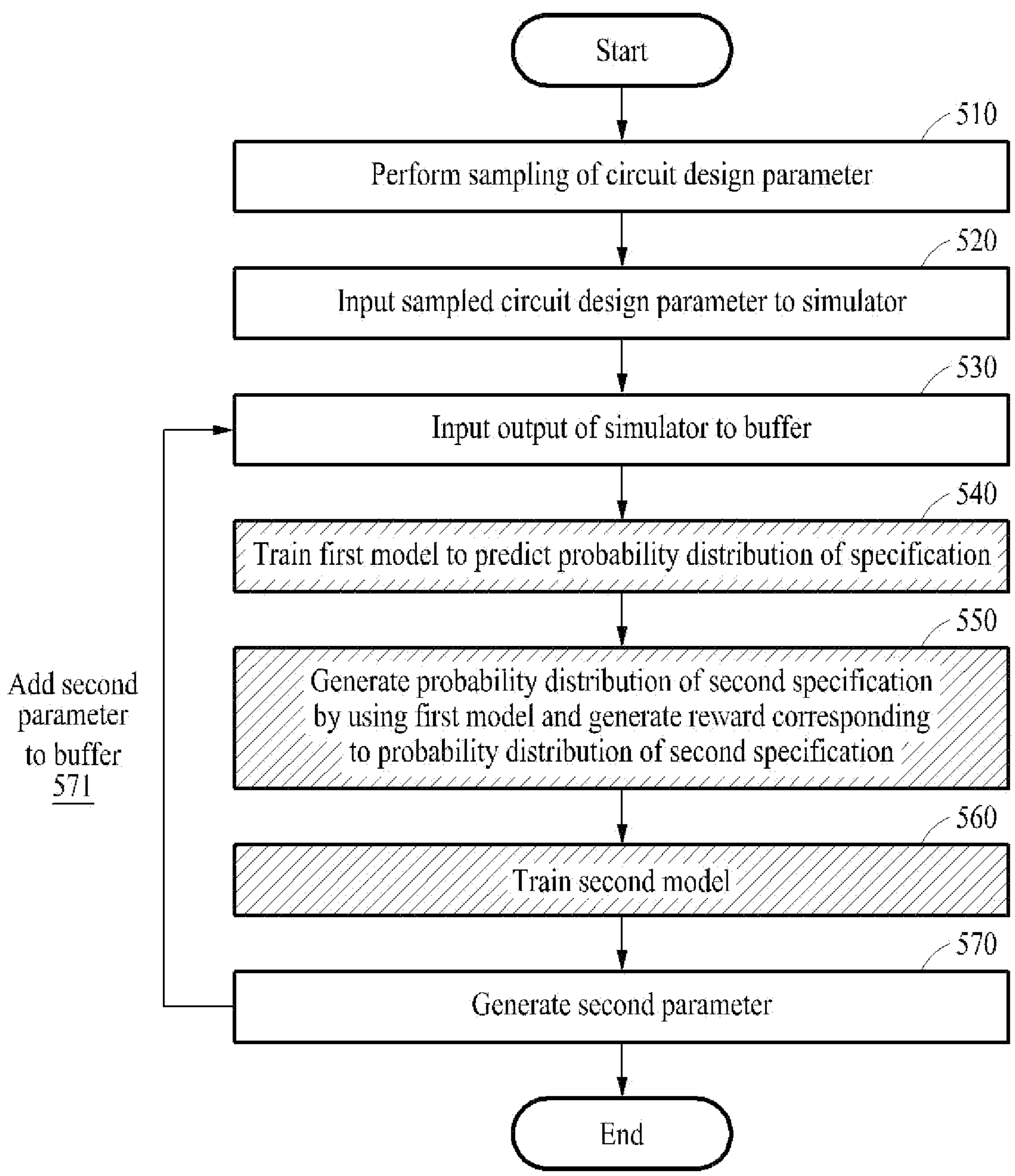
FIG. 5 illustrates an example of a method of training a first model and a second model according to one or more embodiments.

FIG. 5 illustrates an example of a method of training a first model and a second model.

In operation 510, the processor 610, according to an example, may perform sampling of the circuit design parameter. The processor 610 may perform sampling of at least a part of the circuit design parameters included in the parameter set 110. This may be an operation performed to increase the prediction accuracy of the first model 150. The reason is that the prediction accuracy of the neural network may vary depending on the training data.

The processor 610, according to an example, may input a sampled circuit design parameter to the simulator 120 in operation 520. The processor 610, according to an example, may acquire a specification (e.g., the first specification of FIG. 1) corresponding to the sampled circuit design parameter from the simulator 120. The first specification 121 may be an output of the simulator 120.

The processor 610, according to an example, may input the output of the simulator 120 to a buffer in operation 530. The buffer may be a temporary storage space. The buffer may store the sampled circuit design parameter and the output of the simulator 120 (e.g., the first specification 121).

The processor 610, according to an example, may train the first model 130 to predict the probability distribution of the specification. The processor 610 according to an example may train the first model 130 by using the (parameter, specification) data set stored in the buffer. Since the parameter and the specification are stored in a corresponding relationship in the buffer, the first model 130 may be trained to output the probability distribution of the specification corresponding to the parameter, like the simulator 120.

The processor 610, according to an example, may generate the probability distribution 131 of the second specification and generate a reward corresponding to the probability distribution 131 of the second specification by using the trained first model in operation 550. The processor 610 may generate the probability distribution 131 of the second specification by using the trained first model. The probability distribution 131 of the second specification may include the average and standard deviation of the second specification. Accordingly, the processor 610 may generate a reward using the average and the standard deviation of the second specification. In one example, the description of the reward of operation 550 may be similar to the description of FIG. 1, as described above.

The processor 610, according to an example, may train the second model in operation 560. The processor 610, according to an example, may train the second model 150 based on the training data 140 as shown, for example, in FIG. 1. The training data 140 may include a (parameter, specification) data set 310 and the trajectories 320 as shown in the example of FIG. 3. The reward generated through operation 550 may be included in the trajectories 320. In one example, the training of the second model 150 of operation 560 may be similar to the description of the training of the second model 150 as described in FIG. 1.

The processor 610, according to an example, may generate a second parameter by using the trained second model 150 in operation 570. The processor 610 may generate the second parameter, which is an optimal circuit design parameter meeting the target specification, through operation 570. In this case, the second parameter may be a parameter which minimizes the standard deviation or the distribution of the specification among a plurality of parameters meeting the target specification.

The processor 610, according to an example, may add the second parameter to the buffer in operation 571. This may be to use the generated second parameter for training the first model. Accordingly, the processor 610 may update the first model by using the second parameter added to the buffer. The processor 610 may obtain a probability distribution of a new specification by using the updated first model. The processor 610 may adapt the model to a new environment by updating the second model by using the newly obtained probability distribution of the specification. Through this, it is possible to generate an optimal circuit design parameter which satisfies the target specification even in various environments (e.g., various adjustments of the circuit design parameter).

Figure 6:
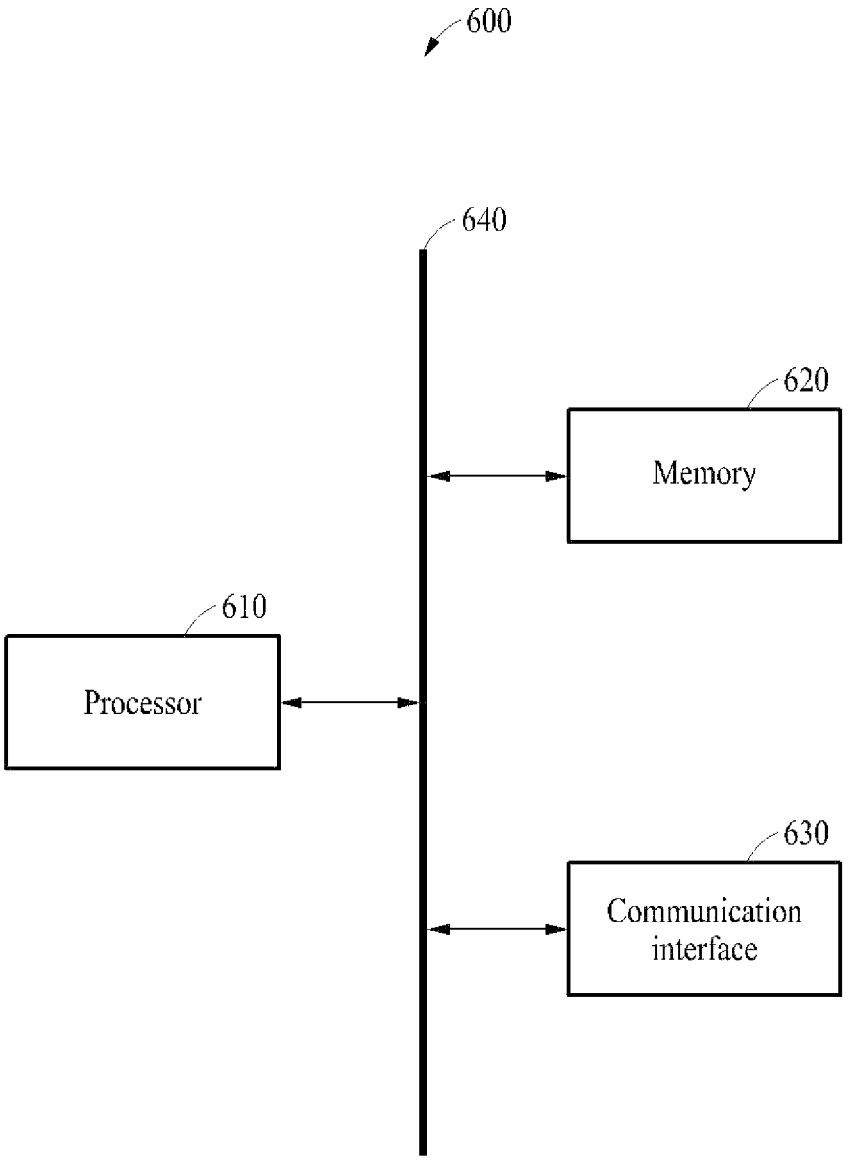
FIG. 6 illustrates an example of an electronic device according to one or more embodiments.

FIG. 6 illustrates an example of an electronic device.

Referring to FIG. 6, an electronic device 600 according to one embodiment may include a memory 620, the processor 610, and a communication interface 630. The memory 620, the processor 610, and the communication interface 630 may be connected to each other via a communication bus 640.

The memory 620 may store a variety of information generated in the processing process of the processor 610 described above. In addition, the memory 620 may store various pieces of data and programs. The memory 620 may include a volatile memory or a non-volatile memory. The memory 620 may include a large-capacity storage medium, such as a hard disk, to store the various pieces of data. The memory 620 according to an example may be the same as or similar to the memory 160 of FIG. 1.

The processor 610 may be a hardware-implemented apparatus having a circuit that is physically structured to execute desired operations. For example, the desired operations may include code or instructions in a program. The hardware-implemented apparatus may include, but is not limited to, for example, a microprocessor, a CPU, a GPU, a processor core, a multi-core processor, a multiprocessor, an application-specific integrated circuit (ASIC), a field-programmable gate array (FPGA), and an NPU.

The processor 610 may execute a program and control the electronic device 600. Program code to be executed by the processor 610 may be stored in the memory 620.

The neural network may output values calculated by an internal parameter (which may refer to the parameter of the neural network, distinguished from the circuit design parameter of FIG. 1) in response to input data. The neural network may also be used in various terms, including artificial intelligence, a model, and a machine learning model. At least a portion of the neural network may be implemented as software, hardware including a neural processor, or a combination thereof. For example, the neural network may correspond to a deep neural network (DNN) including a fully connected network, a deep convolutional network, an RNN, and the like. The DNN may include a plurality of layers. The plurality of layers may include an input layer, one or more hidden layers, and an output layer. The neural network may be trained to perform a provided operation by mapping, based on deep learning, the input data to the output data having a nonlinear relationship. Deep learning is a machine learning scheme for solving a provided problem from a big data set. Deep learning is an optimization process of the neural network which finds a point where the loss function is minimized while training the neural network by using the prepared training data.

The methods that perform the operations described in this application, and illustrated in FIGS. 1-6 are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller, e.g., as respective operations of processor implemented methods. One or more processors, or a processor and a controller, may perform a single operation, or two or more operations.

Instructions or software to control computing hardware, for example, one or more processors or computers, such as processor 610 and memory 620 of FIG. 6, to implement the hardware components and perform the methods as described above may be written as computer programs, code segments, instructions or any combination thereof, for individually or collectively instructing or configuring the one or more processors or computers to operate as a machine or special-purpose computer to perform the operations that be performed by the hardware components, such as the communication interface 630 of FIG. 6, and the methods as described above. In an example, the processor may include a main processor (e.g., a central processing unit (CPU) or an application processor (AP)), or an auxiliary processor (e.g., a graphics processing unit (GPU), a neural processing unit (NPU), an image signal processor (ISP), a sensor hub processor, or a communication processor (CP)) that is operable independently from, or in conjunction with the main processor.

In one example, the instructions or software include machine code that is directly executed by the one or more processors or computers, such as machine code produced by a compiler. In another example, the instructions or software include higher-level code that is executed by the one or more processors or computers using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), EEPROM, RAM, DRAM, SRAM, flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors and computers so that the one or more processors and computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent to one of ordinary skill in the art, after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A method of generating a circuit design parameter meeting a target specification, the method comprising:
- generating a first probability distribution of a first specification using a first model provided a first parameter where the first model is configured to infer a correlation between the first parameter and the first probability distribution;
- generating a second parameter using a second model provided the first probability distribution; and
- updating the first model based on the second parameter,
- wherein the second model is trained by using a reward, the reward being determined based on a second probability distribution of a second specification corresponding to the second parameter.

2. The method of claim 1, further comprising training the first model based on data obtained from a simulator outputting a third specification corresponding to a third parameter.

3. The method of claim 1, further comprising training the first model using training data that includes the first parameter with a third probability distribution, generated by a simulator provided with a third parameter being used as a ground truth.

4. The method of claim 1, wherein the first parameter is a virtual circuit design parameter.

5. The method of claim 4, wherein the second parameter obtained is another virtual circuit design parameter that is provided to the updated first model for further training of the first model.

6. The method of claim 1, further comprising training the second model, wherein the second specification is a state,
- wherein respective operations of adjusting first parameters are actions, and
- wherein the reward is based on the first probability distribution being determined based an increase in a previous action to a current action of adjusting the first parameter.

7. The method of claim 6, wherein the reward is determined based on a value obtained by subtracting a multiplication of a standard deviation of the first specification by a predetermined ratio from an average value of the first specification.

8. The method of claim 6, wherein the actions comprise an operation of adjusting each size of a plurality of transistors into respective different sizes.

9. The method of claim 1, further comprising training the second model, the training comprising assigning a high reward value in response to a standard deviation of the first specification being decreased compared to a previous standard deviation of a previous first probability distribution from the first model, and wherein the first probability distribution comprises the standard deviation.

10. The method of claim 1, further comprising training the second model, the training comprising assigning a high reward value based on an average of specifications and a standard deviation of the first specification being increased compared to a previous average of specifications and standard deviation of the first specification.

11. The method of claim 1, further comprising training the first model, including training the first model to decrease a difference between a third specification obtained by applying the first parameter to a simulator and a first specification.

12. The method of claim 1, wherein the first parameter is the circuit design parameter.

13. The method of claim 12, wherein the circuit design parameter comprises a size of a transistor.

14. The method of claim 12, wherein the circuit design parameter comprises a size corresponding to each of a plurality of transistors.

15. The method of claim 1, further comprising:

transfer learning on the first model and the second model corresponding to a target specification and a new target specification including another specification.

16. A non-transitory computer-readable storage medium storing instructions that, when executed by a processor, cause the processor to perform the method of claim 1.

17. An electronic device, comprising a processor configured to:

train a first model to infer a correlation between parameters and probability distributions with respect to a target circuit design specification;

generate a first probability distribution of a first specification by applying a first parameter as a circuit design parameter, to the first model;

generate a second parameter by applying the first probability distribution of the first specification to a second model; and update the first model based on the second parameter, wherein the second model is updated by using a reward determined based on a second probability distribution of a second specification corresponding to the second parameter.

18. The electronic device of claim 17, wherein the processor is further configured to perform updating of the second model, including using a first reward based on the first probability distribution.

19. The electronic device of claim 18, wherein the reward is further based on an action generated by an actor model provided at least the first probability distribution.

20. The electronic device of claim 17, wherein the training of the first model is dependent on ground truths generated by a circuit design simulator.

* * * * *